United States Patent [19]
Knapp et al.

[11] Patent Number: 5,753,319
[45] Date of Patent: May 19, 1998

[54] METHOD FOR ION PLATING DEPOSITION

[75] Inventors: Jamie Knapp, Mendon; Luke Alec LeBlanc, Framingham, both of Mass.

[73] Assignee: Corion Corporation, Franklin, Mass.

[21] Appl. No.: 400,978

[22] Filed: Mar. 8, 1995

[51] Int. Cl.$^6$ .................................................. C23C 14/08
[52] U.S. Cl. .......................... 427/529; 427/74; 427/108; 427/126.3; 427/255.7; 427/419.3; 427/527; 427/528; 427/585
[58] Field of Search ...................... 427/529, 255.7, 427/419.3, 527, 74, 126.3, 528, 108, 585

[56] References Cited

U.S. PATENT DOCUMENTS

| | | | |
|---|---|---|---|
| 4,254,159 | 3/1981 | Pulker et al. | 427/38 |
| 4,333,962 | 6/1982 | Pulker et al. | 427/37 |
| 4,448,802 | 5/1984 | Buhl et al. | 427/42 |
| 4,619,148 | 10/1986 | Kovacs | 73/862.62 |
| 4,619,748 | 10/1986 | Moll et al. | 204/192.31 |
| 5,102,736 | 4/1992 | Townsend et al. | 428/410 |
| 5,211,759 | 5/1993 | Zimmermann et al. | 118/723 |
| 5,229,570 | 7/1993 | Kaufmann et al. | 219/121.28 |
| 5,250,779 | 10/1993 | Kaufmann et al. | 219/121.12 |
| 5,292,568 | 3/1994 | Tezuka et al. | 428/64 |
| 5,298,290 | 3/1994 | Jost et al. | 427/489 |

OTHER PUBLICATIONS

K. Guenther, Optical Thin films and Applications, *SPIE Proceedings*, 1270:211–221 (1990).
Corion catalog. (No month avail.).

*Primary Examiner*—Bernard Pianalto
*Attorney, Agent, or Firm*—Peter F. Corless; Dike, Bronstein, Roberts & Cushman, LLP

[57] ABSTRACT

The present invention provides multilayer ion plated coatings comprising a titanium oxide as well as methods for applying such coatings onto a variety of substrates. In particular, the invention provides ion plated transparent multilayer coatings comprising layers of titanium oxide (particularly $TiO_x$, $x \approx 2$) and materials of low refractive indices such as $SiO_2$, $Al_2O_3$, MgO etc. Further provided are articles of manufacture comprising such multilayer coatings and novel deposition methods.

8 Claims, 8 Drawing Sheets

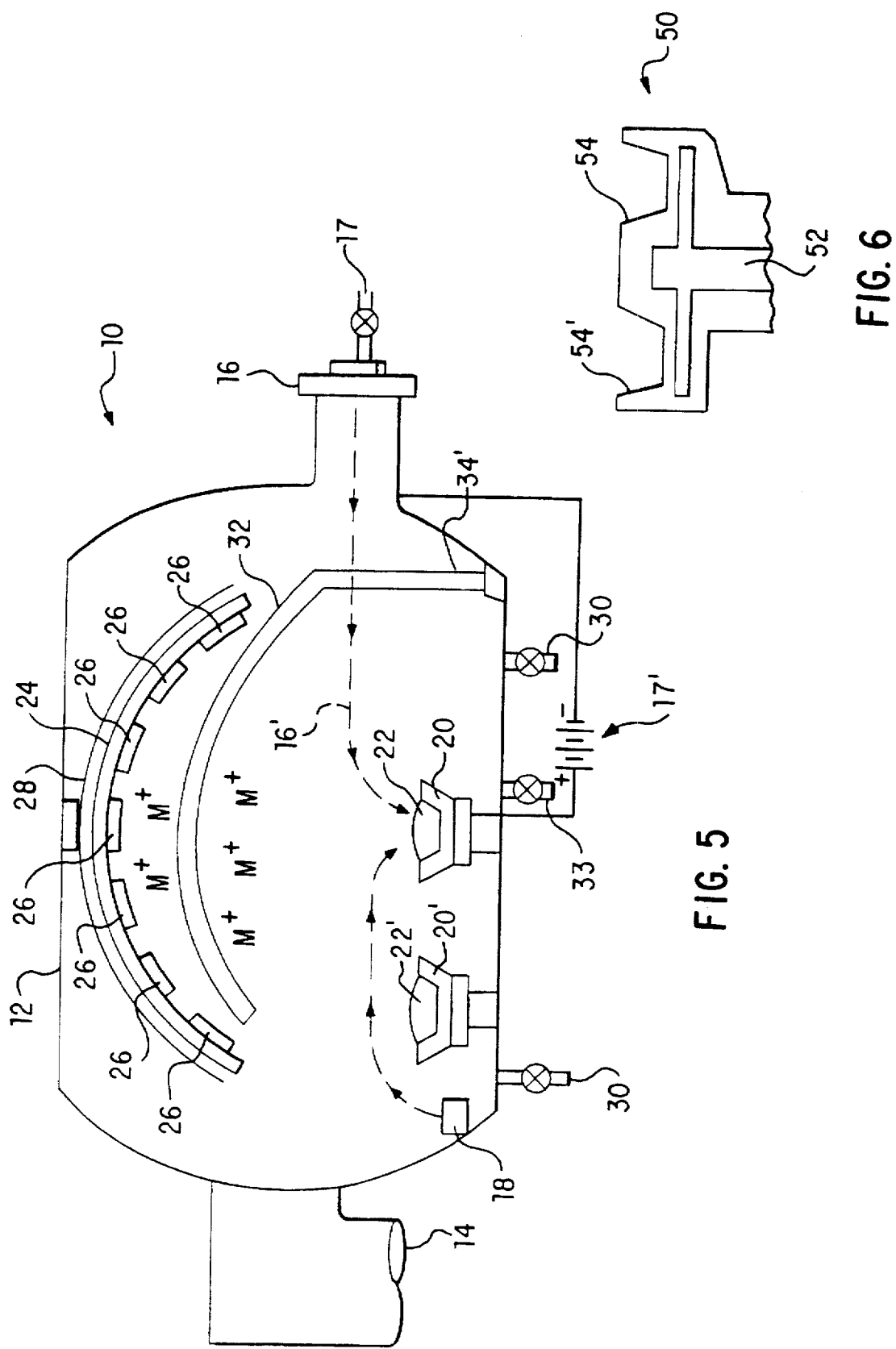

METHOD FOR ION PLATING DEPOSITION

BACKGROUND OF THE INVENTION

1. Field of the Invention

The present invention provides multilayer ion plated coatings comprising a titanium oxide as well as methods for applying such coatings onto a variety of substrates. In particular, the invention provides ion plated transparent multilayer coatings comprising layers titanium oxide (particularly $TiO_x$, $X \approx 2$) and materials of low refractive indices such as $SiO_2$, $Al_2O_3$, MgO etc., articles of manufacture comprising such multilayer coatings, and novel methods for deposition of such multilayer coatings.

2. Background

Optical filters and coatings are passive components whose basic function is to define or improve the performance of optical systems. Applications of optical filters and coatings can be as diverse as anti-glare computer screens, laser devices such as ophthalmic surgical lasers, sighting devices, etc.

Optical coatings have been deposited by Physical Vapor Deposition (PVD) technologies which can be classified into three general categories: soft films, conventional hard coatings, and ion/plasma modified hard coatings.

Soft film technologies generally involve deposition of soft, marginally adherent multilayer thin films onto various glasses. The films are soft and lack physical durability; most films are also water soluble. To protect these sensitive multilayer optical coatings, they are often imbedded onto a transparent epoxy by lamination onto other glass substrates. Optical filters made by a soft film deposition include multiple coating layers and laminations, requiring a burdensome and relatively costly manufacturing process. Moreover, the epoxy laminate effectively limits the useful temperature range of the product (ca.<100° C.), and the epoxy can discolor and degrade when exposed to ultraviolet radiation. Still further, soft film filters can be sensitive to temperature and humidity and therefore have relatively limited operable lifetimes.

Conventional hard coating PVD usually consists of electron-beam evaporated oxides (e.g., $TiO_2$, $Ta_2O_5$, $Al_2O_3$, etc.) layered onto heated substrates (e.g., 250°–300° C.). The deposited films are typically columnar and porous in micro structure. The optical behavior of multiple layers applied by conventional hard coating is not ideal; the refractive indices of evaporated thin films are generally lower than those of corresponding bulk materials. Additionally, conventional hard coatings can absorb and desorb water vapor because of their porous nature. As a result, the spectral behavior of such optical filters can dramatically change and drift, depending upon the environmental exposure. This spectral instability effectively limits the use of such filters for many applications.

In order to circumvent such shortcomings, filters produced by conventional hard coating PVD processes have been encapsulated by laminations to other glass substrates. Such a lamination procedure, however, poses some notable problems. Lamination is costly, can limit the filters to a planar shape and can sacrifice image quality. Another approach has been to use the filters in environmentally controlled housings. This procedure however is also costly and can make use of the filters more burdensome.

Evaporative, ion-assisted deposition processes also have been employed. An ion-assisted process utilizes an ion gun directed toward a substrate within an evaporation coating chamber. When energized, the ion gun directs high-energy particles directly toward the substrate where they collide with previously vaporized coating material that has deposited on the substrate surface. This bombarding action compacts the coating material and creates a denser film structure. However, coatings applied by such ion-assisted methods can eventually spectrally shift over extended periods of time. Additionally, the bombarding high-energy particles tend to become incorporated into the coating layer which may degrade the coating quality and adversely effect the coating density. This process is also difficult to optimize in terms of uniformly creating homogeneous, dense films over large areas, which is needed for high yield, high volume production.

Ion plating processes also have been used to apply coatings. In general, an ion plating deposition process employs a plasma-supported reactive evaporation of a coating material in a vacuum, particularly by vaporizing the coating material by means of an electron beam under reduced pressure. During the process, substrates obtain a negative electrical charge. The vaporized coating material is in the form of positively charged ions. This coating material is directed to and then condensed on the targeted substrate. The high energy of this condensate (e.g., on the order of 20 to 100 eV) is due to electromagnetic attraction between the ionized coating materials and the negatively biased substrates. This is distinct from an ion-assisted process where the energized ions from an electron gun are directed toward the substrate and merely compact the previously vaporized, deposited coating material. See, for example, the processes and apparatus reported in U.S. Pat. Nos. 4,333,962, 4,448,802, 4,619,748, 5,211,759 and 5,229,570. Coating films applied by an ion plating deposition process are completely dense and do not spectrally shift upon exposure to varying temperature and humidity conditions.

Certain coating materials, including low and high refractive index materials in combination, have been deposited to produce optical interference filters. Low refractive index ($n_L$) materials include e.g. $SiO_2$, $Al_2O_3$, SiO, fluorides such as barium fluoride and lanthanum fluoride, MgO, etc. Collectively, low-index materials are sometimes referred to herein as "L". Low-index materials (L) are defined to mean herein materials having a refractive index (20/D) of less than 2.0, more typically 1.8 or less such as 1.8 to 1.3. Common high refractive index ($n_H$) materials include e.g. $TiO_2$, $ZrO_2$, $Ta_2O_5$, and $HfO_2$. Collectively, these high-index materials are sometimes referred to herein as "H". High-index materials (L) are defined to mean herein materials having a refractive index (20/D) of 2.0 or greater. As known to those skilled in the art, the designation "20/D" indicates the refractive index values are as measured at 20° C. using a light source of the D line of sodium.

Ion plated optical interference coatings are often produced by successive deposition of alternating layers of L and H thin films (each film layer typically tens of nanometers thickness for visible wavelength optical performance). Coating layers having alternating L and H thin films are sometimes designated herein as L/H coatings or other similar designation. A common such multilayer combination has been $SiO_2$ (a low index material)+$Ta_2O_5$(a high index material). Procedures for depositing the alternating layers have included use of an ion plating coating apparatus that has two separate electron beam guns, with one electron beam directed to a containment vessel containing the L layer reagent (e.g., a Si reagent) and a second electron beam gun directed to a containment vessel containing the H layer reagent (e.g., tantalum).

The two electron beam guns are alternatively operated without interruption to thereby apply alternating L and H layers, e.g., alternating $SiO_2$ and $Ta_2O_5$ layers.

However, it has been found that ion plated L/H multilayer coatings of many materials (including e.g. $Ta_2O_5$/$SiO_2$ multilayer coatings) exhibit physical properties that are undesirable for many critical applications. In particular, ion plated L and H multilayer coatings often exhibit significant compressive coating stress which can lead to physical deformation of the underlying substrate. A deformed substrate can also interfere with optical properties of the applied coating layer, particularly image resolution.

Certain other ion plated L/H multilayer coatings have exhibited substantial optical absorbance rendering the coatings of little or no use for many applications. This absorbance problem has been particularly severe for multilayer coatings that contain layers of titanium oxide. In K. H. Guenther, *Optical Thin Films and Applications*, 1270: 211–221 (August 1990), it is reported that the measured spectral transmittance of a multilayer stack of $SiO_2$ and titanium oxide is 28% lower than theoretical transmittance. See FIG. 11 of the Drawings which graphically depicts those results reported by K. H. Guenther.

It thus would be desirable to have improved multilayer L/H-type ion plated coatings, including such coatings that exhibit low optical absorbance and low stress. It would be particularly desirable to have improved highly transparent ion plated coatings that contain layers of the high refractive index material titanium oxide (especially $TiO_x$, $x\approx 2$). It would be especially desirable to have highly transparent multilayer ion plated coatings that contain layers of titanium oxide and silicon dioxide.

SUMMARY OF THE INVENTION

We have now discovered new ion plated L/H-type multilayer coatings that contain titanium dioxide with substantially improved physical characteristics. In particular, titanium oxide multilayer coatings of the invention exhibit substantially decreased optical absorbance and relatively low coating layer stress relative to prior conventional and ion plated titanium oxide multilayer coatings. The coatings of the invention are therefore useful for a number of applications where prior titanium oxide multilayer coatings could not be successfully employed. Specifically, the titanium oxide multilayer coatings of the invention are highly useful as optical filters and coatings for a variety of devices, and are particularly useful as optical and passivation coatings on electronic devices (both light emitting and light detecting) such as LEDs and photodetectors.

The invention further includes new methods for depositing ion plated L/H-type titanium oxide multilayer coatings that exhibit significantly enhanced performance characteristics at lower manufacturing costs relative to coatings applied by prior methods. The methods of the invention include control of the titanium reagent material temperature during ion plating deposition of an L film layer as well as control of the concentrations of active (vaporized) reagents that form an L film layer.

More specifically, in one aspect, the invention provides a method for ion plating deposition of a coating comprising alternating layers of a titanium oxide and L material on a substrate by first depositing an ion plated titanium oxide film layer on the substrate; then cooling the titanium reagent material in the coating vessel to below its ion plating deposition temperature, preferably to a substantially non-vaporization temperature, e.g. to a temperature where a solid phase of titanium reagent is present in the reagent containment structure; and thereafter depositing an ion plated L layer such as a $SiO_2$ layer over the titanium oxide film layer.

In another aspect, a further method for ion plating deposition of a coating of alternating layers of an L material and a titanium oxide on a substrate is provided, the method comprising providing a substrate having on a surface thereof a titanium oxide film layer; and depositing an ion plated L layer such as a $SiO_2$ layer that is formed from a metal and oxygen-containing reagents over the titanium oxide film layer, wherein the L metal and oxygen reagents are present to form the layer in amounts sufficient to inhibit formation of optically absorbing titanium oxide or L materials. Typically, the underlying titanium oxide layer will be deposited on the substrate surface by ion plating, and during the same coating cycle as the L layer deposition. By stating the active reagents are present to form the layer, it is meant that the reagents are present in evaporated, ionized form, e.g. Si and oxygen ions in the case of deposition of a $SiO_2$ layer. As discussed more fully below, if the concentrations of the active oxygen reagent is excessive, optically absorbing higher order titanium oxide species may form on the previously deposited titanium oxide layer. If the concentration of the L metal reagent is insufficient, optically absorbing suboxide silicon species ($Si_xO_y$ where $y/x<2$) may be deposited.

Preferably, to inhibit formation of optically absorbing titanium oxide or L materials in accordance with the invention, the L layer is deposited at a rate decreased relative to prior procedures, which prior procedures include L layer deposition rates of 0.5 nm/second or greater. It is further preferred that the active oxygen reagent concentration is maintained at a constant level, and the L layer deposition rate is decreased by decreasing the concentration of the active (vaporized) L metal reagent proximate to the substrate to be coated.

The titanium oxides of the ion plated coatings of the invention are preferably a substantially transparent titanium oxide, particularly materials of the formula $TiO_x$, where x is equal to or approximately 2. It is also preferred that a titanium oxide coating layer be substantially or completely amorphous, to enhance the transparency of the coating layer. Typically coatings of the invention exhibit quite low absorbance of light intended for transmission, i.e. coatings of the invention (including coatings having a total of about 100 or less or 70 or less film layers) are substantially transparent and transmit e.g. at least about 80, 85 or 90 percent of light relative to theoretical levels, as determined by standard techniques such as a spectrophotometer. More typically a coating of the invention is essentially transparent and transmit e.g. at least about 95 or 96 percent of incident light intended for transmission (relative to theoretical levels). Particularly preferred multilayer coatings of the invention transmit about 97 to 99 percent or more of light intended for transmission (relative to theoretical levels). Theoretical transmission levels as referred to herein are calculated from the known bulk absorbance properties of the constituent materials of a coating. Such bulk properties are published and otherwise well known or can be readily calculated as known to those skilled in the art.

It has been found that optical absorption in multilayer coatings (particularly L/$TiO_x$($x\approx 2$) coatings) is particularly pronounced when L layers (e.g., $SiO_2$) are deposited upon previously deposited H layers (titanium oxide). While not wishing to be bound by theory, it is believed such optical absorption is dominated by absorption occurring at the film-to-film interfaces. It was found that a standard 60 layer titanium multilayer coating applied by prior ion plating techniques with L layers (SiO$_2$) deposited on H layers (titanium oxide) measured with ≧29% overall optical absorption. Coatings exhibiting such high levels of absorption are unsuitable for many, if not most, targeted applications.

The methods of this invention, however, can provide ion plated titanium oxide multilayer coatings of substantially decreased optical absorption, including with the overall absorption measured of the above-mentioned 60 layer design measuring less than about 2%. That significant reduction in optical absorbance makes, for the first time, the ion plating of L/titanium oxide multilayer coatings a viable manufacturing process to produce highly useful products.

The invention also provides articles of manufacture comprising a substrate that contains an ion plated multilayer L/titanium oxide coating. The substrate may comprise one or more of a variety of materials, e.g. a glass, plastic, semiconductor or metal material. Preferably, the coating layer functions as an optical filter for the article, and the article is a bandpass filter, edge filter, antireflection coating, reflector coating, etc. Also preferred is where the coated article is a semiconductor substrate (such as a silicon wafer) or a microelectronic device, including light emitting and light detecting devices such as a light emitting diode or a photodetector. Coatings of the invention may be employed for transmission of light of a wide range of wavelengths, including infrared through visible wavelengths (e.g., about 400 to 5000 nm), depending on the constituents and construction of the titanium oxide multilayer coating. Particularly preferred applications include high performance fully blocked narrow (e.g., about 10 nm width) visible bandpass filters that contain optical coatings of the invention consisting of TiO$_x$ (x≈2) and SiO$_2$ layers.

Other aspects of the invention are disclosed infra.

BRIEF DESCRIPTION OF THE DRAWINGS

FIG. 5 is a schematic view of a preferred ion plating coating apparatus.

FIG. 6 is a schematic cut-away view of a preferred cooling system for reagent coating materials.

DETAILED DESCRIPTION OF THE INVENTION

The present invention comprises new multilayer ion plating coatings that contain layers of titanium oxide (typically TiO$_x$, x≈2) and layers of an L material such as SiO$_2$, Al$_2$O$_3$, SiO, a fluoride, MgO, and the like, and methods for deposition of such multilayer coatings.

Ion plating coatings containing titanium oxide have a number of significant benefits. The shortcomings of L/H multilayer coatings deposited by prior ion plating procedures as discussed above, however, are particularly frustrating with respect to titanium oxide because of optical absorbance. The present invention can substantially reduce, if not effectively eliminate such absorbance exhibited by prior L/titanium oxide multilayer ion plated coatings.

The benefits of titanium oxide, particularly TiO$_x$ (x≈2), include its extremely high refractive index ($n_H$), especially relative to other materials such as Ta$_2$O$_5$ that are used for visible to infrared coating applications (i.e., transmissions of radiation of about 390 nm to about 5000 nm wavelengths). Thus at 500 nm, the refractive index of ion plated TiO$_x$ (x≈2) is 2.575, while the index of refraction ion plated Ta$_2$O$_5$ is 2.21 (20/D). Ta$_2$O$_5$ is a common H material used in current L/H-type ion plated multilayer coatings, such as Ta$_2$O$_5$/SiO$_2$ multilayer plated coatings used as optical filters.

That high refractive index of TiO$_x$ (x≈2) provides a high refractive "contrast" (i.e., $n_H/n_L$) when used in a L/H multilayer coating. Consequently, manufacturing time and costs can be substantially decreased by use of the material. Thus, with respect to Ta$_2$O$_5$ which is a currently used material as discussed above, since the $n_H/n_L$ for a TiO$_x$/SiO$_2$ coating is higher than the contrast for a Ta$_2$O$_5$/SiO$_2$ multilayer coating, less material (less film layers) would be needed for the TiO$_x$/SiO$_2$ coating to provide the desired performance properties. Such advantages of ion plated TiO$_x$ (x≈2) multilayer coatings relative to ion plated Ta$_2$O$_5$ multilayers currently in common use are further shown by the results depicted graphically in FIGS. 1–4 of the drawings.

Figure 1:
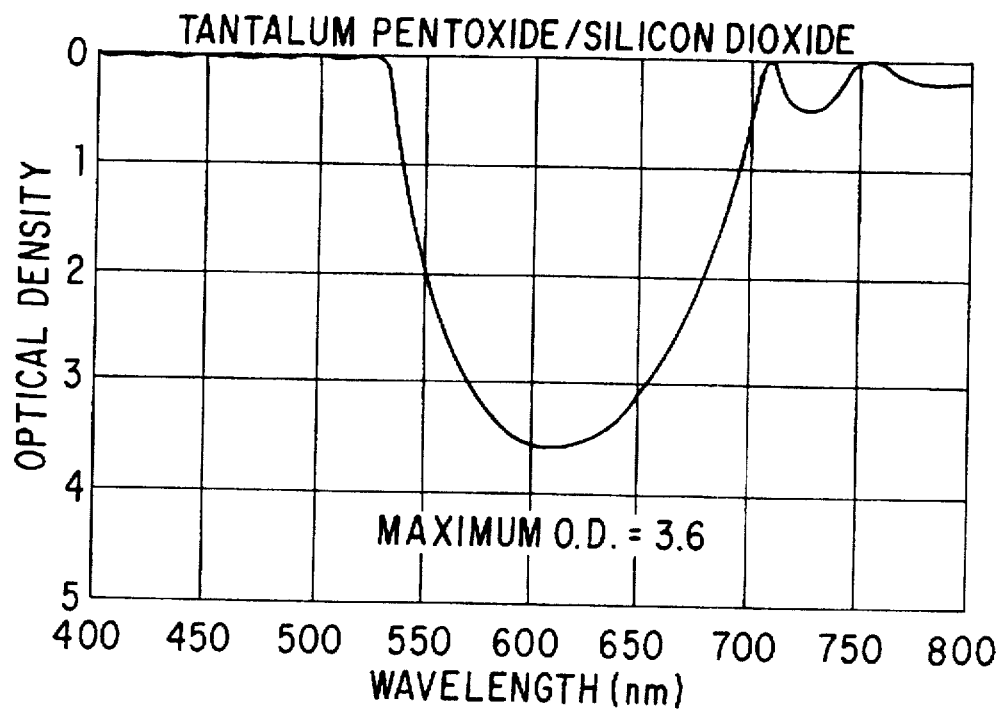
FIGS. 1–4 depict results with multilayer coatings of the invention and prior coatings.
Figure 2:
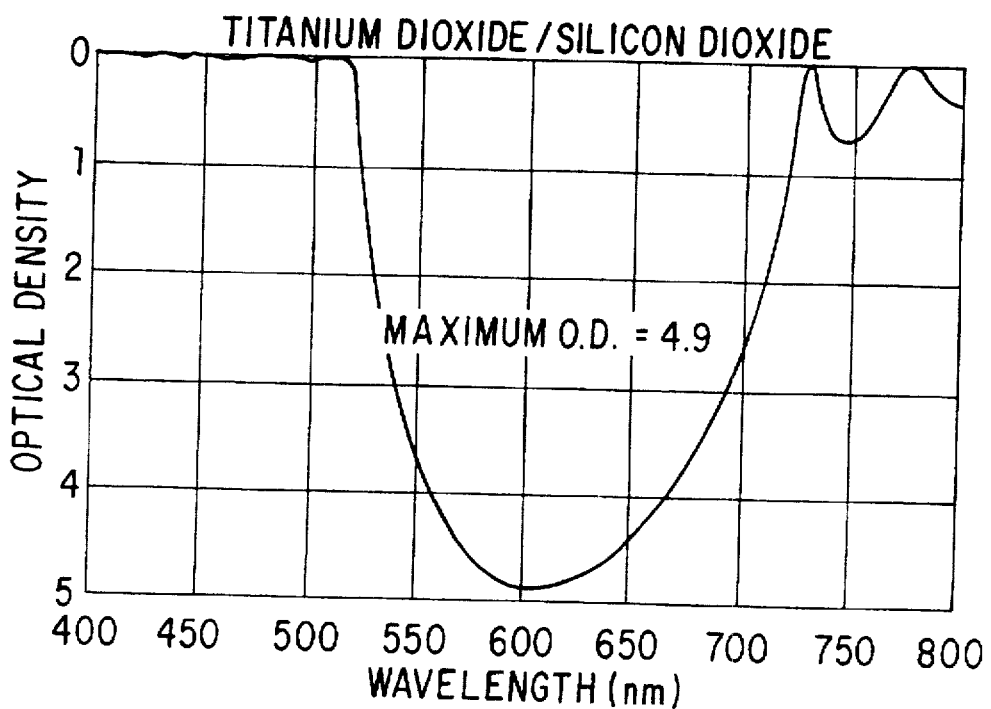
Figure 3:
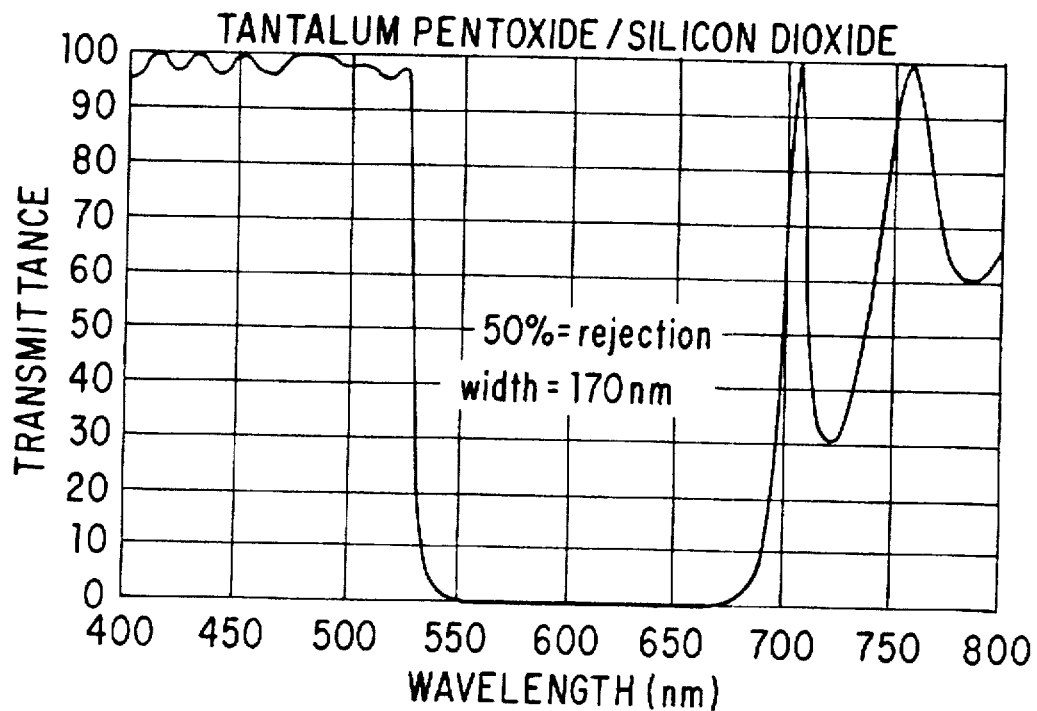
Figure 4:
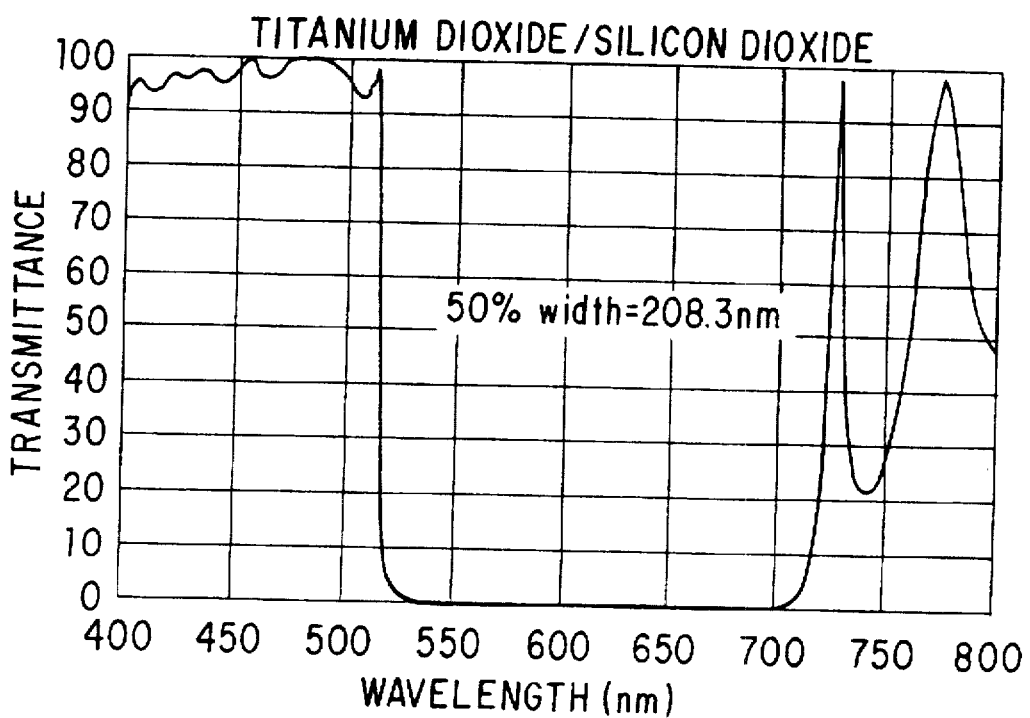

Specifically, FIG. 1 illustrates a 10-period first order notch filter design (0.125 L 0.25 H 0.125 L)10 using L=SiO$_2$ and H=Ta$_2$O$_5$. As is understood by those skilled in the art, 0.125 L refers to an optical thickness of an ⅛-wave of the L material (SiO$_2$); 0.25 H refers to an optical thickness of a quarter-wave of an H material (Ta$_2$O$_5$); and 0.125 L refers to an optical thickness of an eighth-wave of the L material (SiO$_2$). The same design employing SiO$_2$ and TiO$_x$ (x≈2) (i.e. (0.125 L 0.25 H 0.125 L)10 where L=SiO$_2$ and H=TiO$_x$ (x≈2)) is shown in FIG. 2. As can be seen by comparison of FIGS. 1 and 2, the design tested in FIG. 2 has 36% deeper wavelength rejection (optical density) than the filter manufactured with Ta$_2$O$_5$ depicted in FIG. 1. FIG. 3 shows results of the same SiO$_2$/Ta$_2$O$_5$ design of FIG. 1, but illustrates a wavelength rejection bandwidth of 170 nm. FIG. 4 shows the same SiO$_2$/TiO$_x$ design of FIG. 2 having a rejection bandwidth of 208.3 nm, a 22.5% improvement over the SiO$_2$/Ta$_2$O$_5$ coating (FIG. 3).

Due to the bombarding action of ion plating deposition, many ion plated coating layers will exert compressive forces onto the underlying substrate thereby deforming the substrate. In particular, currently employed material combinations involving L materials such as SiO$_2$ and standard high index materials (e.g., HfO$_2$, ZrO$_2$, Ta$_2$O$_5$) often provide highly compressively stressed ion plated coatings that deform the underlying substrates. Such substrate deformation can interfere significantly with the optical properties of the filter (e.g., image resolution). In the case of thicker substrates, the compressive coating stress can also cause problems and reduce coating layer adherence and result in the stressed coatings pulling away from the substrate.

It has been found, however, that preferred ion plated titanium oxide coatings of the invention exhibit low stress, particularly relative to other current ion plated multilayer coatings such as SiO$_2$/Ta$_2$O$_5$ coatings. That low coating stress is a particular benefit for many applications including deposition onto relatively thin substrates such as glass, semiconductor or other substrates having a thickness of about 1 mm or 0.75 mm or less. Complex multilayer titanium oxide coatings ion plated onto glass substrates as thin as 0.5 mm thick have been prepared in accordance with the invention, and do not suffer from deformation. Less stress in the multilayer coatings also contributes to greater filter longevity and reliability. While not wishing to be bound by theory, it is believed the decreased coating stress of an ion plated titanium oxide coating layer of the invention results from the inherent tensile forces exerted by a titanium oxide film layer, irrespective of the method employed to deposit the coating, which tensile forces are effectively "neutralized" by the compressive effects of ion plating to thereby provide a low stress coating.

A preferred method of ion plating in accordance with the invention is conducted as follows, although it should be appreciated that the present invention is in no event limited to the following exemplary protocol and apparatus. The ion plating coating apparatus used for purposes of the present invention suitably may be a commercially available ion plating coating device, e.g. the BAP 800 Batch Ion Plating System available from Balzers Aktiengesellschaft (Liechtenstein). A wide variety of other apparatus that include ion plating deposition also may be employed. See also the above mentioned U.S. Patents for coating devices that may be useful for purposes of this invention.

FIG. 5 shows a suitable ion plating coating apparatus 10 of the invention. Coating apparatus 10 includes an evacuatable coating vessel 12, an evacuation or vacuum apparatus 14 in communication with vessel 12 for providing a vacuum to vessel 12; a deposition plasma source 16 and one or more electron beam guns 18 which supply electrons of energy directed towards a containment structures 20, 20' that contain the coating materials 22 and 22'. Structures 20, 20' suitably may be copper crucibles, preferably with a molybdenum liner. Coating material 22 suitably will be a reagent used to form a titanium oxide layer; e.g. the reagent may be $Ti_3O_5$, Ti, TiO, $TiO_2$, with $Ti_3O_5$ being generally preferred. Coating material 22' suitably will be a reagent such as silicon metal used to form a L material layer. Additional containment vessels may be employed if desired. For example, to apply alternating layers of more than two materials on a substrate (e.g., alternating layers of $TiO_x$, $SiO_2$ and $Al_2O_3$), one crucible will contain a first source chemical (e.g., the $TiO_x$ source material), a second crucible will hold a second source chemical (e.g., the Si source material) and a third crucible will hold a third source chemical (e.g. Al as the source material for the $Al_2O_3$ layer), and the source chemicals will be separately activated by one or more electron guns.

A substrate support structure 24 holds one or more substrates 26 during the coating process and is positioned opposite the containment structures 20, 20'. Preferably the substrates 26 are cleaned, e.g. either mechanically (e.g. ultrasonically in non-ionic detergent) or chemically (e.g., organic solvent(s)) prior to being loaded into the coating vessel 12. A wide variety of substrates may be employed for purposes of the present invention including e.g. optical color filter glasses, visible transmitting glasses, semiconductor substrates and electronic devices such as microelectronic wafers and detector devices. Typical optical color filter glasses include Schott glasses (such as those sold under the tradenames UG, BG, VB, GG, OG, RG and KG); Hoya color filter glasses, particularly UV transmitting and visible blocking glasses (e.g. the material sold under the tradename of U-360); Sharp cut filters (e.g. Hoya's Y, O, R, B, G); Cyan glass (e.g. Hoy's CM-500); IR blocking glass (e.g. Hoya's LP-15) and IR transmitting glasses (e.g.

Hoya's R-72 and IR-80). It has been found that the methods of the invention enable successful deposits of thick complex multilayer coatings onto both ionically and colloidally colored glasses. Many colloidally colored glasses come in two forms: those with reasonably good stain resistance, and those having significantly poorer stain/acid/ alkali resistance. Exemplary visible transmitting glasses include crown glass, soda-lime float glass, natural quartz, synthetic fused silica, sapphire and Schott BK-7. Typical semiconductors comprise materials such as silicon, germanium, indium antimonide and HgCdTe.

A heating device 28 heats one or more substrates 26 to be coated, and one or more gas sources depicted as dual feedlines 30 in FIG. 5 allow for the introduction of reactive gases for use during deposition of the coating material.

The ion plating coating apparatus also may contain, if desired, a pretreatment gas plasma source 32 and a pretreatment gas source, depicted as feedline 33, for introducing a pretreatment gas such as oxygen, argon or nitrogen into coating vessel 12. Use of such a pretreatment gas source has been disclosed in copending and commonly assigned U.S. patent application Ser. No. 08/349,623, filed Dec. 5, 1994. As disclosed in said copending application, use of a pretreatment plasma step, prior to ion plating deposition, can result in the subsequently applied ion plated coating layers having significantly improved physical properties, particularly improved durability and substrate adherence.

A pretreatment plasma step, if employed, may be conducted as follows. A vacuum is applied to vessel 12 to apply a reduced pressure therewithin, e.g. to less than about $5\times10^{-6}$ mbar, and the substrate(s) 26 are preferably heated by suitable heating means such as a Calrod heater, typically to a temperature in excess of about 150° C. or 200° C. such as about 250° C. The one or more selected pretreatment gases is added (e.g. through pretreatment gas inlet 33) to the vessel to a pressure sufficient to enable a current to be generated within vessel 12, typically a pressure greater than about $5\times10^{-3}$ mbar, particularly from about 1 to $4\times10^{-3}$ mbar. The pretreatment plasma source 32 is then activated to immerse or otherwise contact the one or more substrates 26 (optionally cleaned, but not yet subjected to ion plating deposition) with a gas plasma. Suitable application conditions of the pretreatment plasma source may vary with several factors and can be readily determined empirically based on the disclosure provided herein. Suitable conditions may vary with substrate being treated, the conditions within vessel 12 such as the respective positioning of substrate(s) 26 and pretreatment gas plasma discharge source and the pressure within the vessel. Typical conditions for pretreatment of a substrate heated to a temperature of about 250° C. with oxygen of pressure of about $1-4\times10^{-2}$ mbar with a glow discharge electrode as a pretreatment plasma source device include: a voltage of from about 4.0 kV to about 5.0 kV, more preferably about 4.5 kV; a current of from about 200 to about 600 mA, more preferably from about 250 to about 500 mA, still more preferably from about 300 to 350 mA; a duration of glow of at least about 10 minutes, more preferably from about 20 to about 60 minutes, still more preferably from about 30 to 45 minutes; and the substrate positioned a distance of about 20 to 40 mm beyond the discharge dark space, particularly about 25 mm beyond the discharge dark space. All voltage references made herein are in reference to a ground potential which is applied to a wall of the coating vessel. Other pretreatment gases may be suitably applied to a substrate surface under the same or similar conditions. Other suitable pretreatment gases include both inert and reactive-type gases e.g. argon, nitrogen, He, $H_2$, or a halide (particularly a fluoride, chloride or bromide), or a mixture of gases may be used as a pretreatment gas such as a mixture of argon and nitrogen, or forming gas (e.g. $H_2+N_2$). It is typically preferred that in the case of applying an oxide-based coating layer, such as a coating layer that comprises $SiO_2$, $TiO_x$, etc. the substrate is pretreated with oxygen. It is believed that such a pretreatment can result in "implanted" surface/subsurface oxygen that provides additional bonding points onto which the subsequently deposited oxide-based coating material can adhere. For similar reasons, the substrate may be preferably pretreated with nitrogen if a nitrogen-containing coating layer is to be deposited. Optimum operating conditions for other plasma sources than a glow discharge electrode (e.g. a plasma source with associated electron gun positioned within the coating vessel and directed at the surface of the substrate to be coated) may of course differ from those conditions set forth above, but can be readily determined by those skilled in the art. After the pretreatment plasma step is completed, a coating layer is then applied by ion plating as disclosed herein.

Suitable pretreatment plasma sources include an elongate glow discharge rod 32 that is powered by a D.C. glow discharge power supply (not shown). Preferably the glow discharge electrode 32 extends through the interior space of vessel 12 and spaced substantially opposite a substrate support structure 24. Preferably, the discharge source 32 has a geometry that corresponds to that of the support structure 24 to thereby more uniformly apply a pretreatment gas plasma onto substrates positioned on structure 24. For example, as shown in FIG. 5, the pretreatment plasma source 32 has a curved, elongate shape that corresponds to the dome shape of structure 24. Substrates 26 should be positioned beyond the discharge dark space of a glow discharge electrode 32, most preferably about 25 mm beyond the dark space so the discharge electrode 32 and opposing surfaces of substrates 26 are separated by about 75 to 80 mm. Pretreatment plasma source 32 is suitably fabricated from a metal, e.g. a solid aluminum rod that is between about 0.75 to 1.5 inches in diameter, more preferably about one inch in diameter. Pretreatment plasma source 32 is suitably connected via a vacuum feedthrough 34 (rotating and/or translational) to a high voltage glow D.C. discharge power supply. After the pretreatment step, the glow discharge rod is preferably moved away from the one or more substrates 26 positioned on support structure 24. The translation/rotational vacuum feedthrough facilitates such withdrawal of the glow discharge rod, e.g. the glow discharge rod can be withdrawn down and away from the substrates via the feedthrough in the coating vessel.

To deposit a coating layer in accordance with the present invention, coating vessel 12 is evacuated by vacuum system 14 to provide a base vacuum to the coating vessel such as less than about $3 \times 10^{-6}$ mbar. Vacuum 14 suitably may be an oil diffusion pump with a Roots Blower.

One or more electron beam guns 18 are employed to supply electrons of energy and in use direct an intense electron beam into the containment structure 20, 20' to vaporize the coating material 22 and 22' contained therein. Preferably two 270° electron beam guns are employed. Deposition plasma source 16 suitably includes a heated tantalum filament and gas inlet 17. Deposition plasma source 16 is suitably connected to the electrically conductive containment structure through a low voltage high current power supply 17'.

The electrically insulated substrate support structure 24 is suitably a rotating, elongate, dome-shaped structure as is known in the art suspended from ceiling of vessel 12 as generally illustrated in FIG. 5. The substrate structure 24 also may be of other configurations, e.g., having a substantially flat surface or cone-shaped. As a result of the deposition plasma discharge operated during the coating step, substrates 26 positioned on structure 24 become negatively self-biased and the vaporized coating material ($M^+$ in FIG. 5) activated by the deposition plasma becomes highly energetic, ionized and chemically reactive. This energized material ($M^+$) is attracted to the one or more substrates 26 via electromagnetic coulomb attraction followed by subsequent film deposition. The deposition plasma and coating procedure may be commenced immediately after the gas plasma pretreatment is completed, without vacuum interruption.

The coating apparatus preferably also includes a heating device 28 for heating of the substrate(s) to be coated as discussed above. Suitably a Calrod heater is employed and is positioned above the substrates as generally shown in FIG. 5. Other heating devices such as quartz lamps also may be used. The coating apparatus 10 suitably may include other devices, e.g., auxiliary coils for the production of magnetic fields, etc., as are generally known in the art.

As discussed above, the coating apparatus also contains a reactive gas source, illustrated as plurality of gas feedlines 30 in FIG. 5, which discharge one or more reactive gases at a position proximate to the containment structures 20, 20' so that an effective density of reactive gas can mix and react with material vaporized from structures 20, 20' during the ion plating coating step. A variety of gases such as oxygen, nitrogen, aliphatic and aromatic hydrocarbons (e.g., acetylene, methane, ethane, propylene, benzene, etc.) and others can be introduced into the coating vessel 12 through reactive gas feedline(s) 30 depending on the coating material that is to be deposited. For example, to deposit titanium oxide (including $TiO_x$, $X \approx 2$), $SiO_2$, $Al_2O_3$ and other oxygen-containing layers, oxygen ($O_2$) will be supplied through one or more feedlines 30 to react with the source chemical (metal) vaporized from containment structure 20 or 20'. Additionally, a mixture of reactive gases may be introduced into vessel 12 to produce a coating layer on the one or more substrates 26 of a desired composition. For example, nitrogen and acetylene may be simultaneously supplied through separate lines 30 to provide a carbonitride-type coating on the substrates 26. Coating layers of other compositions also may be applied as will be appreciated by those skilled in the art.

Multilayer coatings of the invention may include a wide number of separate H (titanium oxide) and L layers, including 20, 40, 50 or 100 or more successive ion-plated coating layers. Thicknesses of coating layers applied in accordance will typically vary from tens of nms per layer to hundreds of nms per layer, depending on applications, as will be appreciated by those skilled in the art. Typically each layer of a multilayer coating of the invention will have a thickness of from about 10 to 500 nm, more typically from about 30 to 200 nm. The layers also may vary in sequence, such as a consistent alternating of L and H layers, or alternatively multiple L layers of different materials (e.g., successive layers of $SiO_2$ and $Al_2O_3$) which are then followed by a titanium oxide layer. Preferred for many applications is a substantially consistent alternating layers of $SiO_2$ and transparent amorphous titanium oxide (especially $TiO_x$ ($x \approx 2$)), i.e. a consistent sequence of $SiO_2$ layer, $TiO_x$ layer, $SiO_2$ layer, $TiO_x$ layer, etc. As is known to those skilled in the art, a coating's optical properties can be controlled by the sequence and composition of the deposited layers as well as the physical thicknesses of those layers. Thus, for example, for design of a bandpass filter that passes radiation of only a selected wavelength, a coating would be deposited that is of specified layers of materials of a selected sequence and thickness so that the coating would function as desired.

During the ion plating deposition of multilayer coatings of the invention, the temperature of the titanium reagent material is controlled during ion plating deposition of an L film layer, and/or the concentration of active reagent(s) that form the L film layer is controlled. Preferably both the temperature of the titanium reagent material and the concentration of the L layer active reagent(s) are controlled during ion plating. Preferably such temperature control and/or reagent concentration control is conducted for each layer of a multilayer coating of the invention.

More specifically, to deposit a titanium oxide coating layer, particularly a $TiO_x$ (x being about 2) layer onto a substrate, titanium is placed in containment structure 20 and is vaporized therefrom by an electron beam 16'; oxygen is simultaneously introduced through lines 30 to provide a reaction effective oxygen partial pressure over the containment structure, e.g., a partial pressure of about $5 \times 10^{-4}$ to about $1 \times 10^{-3}$. Desired pressure within the coating vessel can be maintained by closed loop pressure control or mass flow. The reactive gases are typically continuously fed into vessel 12 during coating to maintain a substantially constant concentration thereof.

Prior to commencing deposition of a L film layer over such a deposited titanium oxide layer and activating the deposition plasma source to vaporize L layer reagent materials, the titanium source material, contained in structure 20 in exemplary FIG. 5 is allowed to cool from its deposition vaporization temperature, preferably to a temperature wherein a solidified phase (non-molten) of the titanium source material can be detected such as visually (naked eye) or by other technique.

Such cooling of the titanium oxide reagent material can be accomplished by a variety of methods. For example, after deposition of a titanium oxide film layer is complete, and the electron beam that vaporizes the titanium oxide reagent material 22 is terminated, a period of time may be allowed to elapse before directing an electron beam (e.g., 16' in FIG. 5) to the L layer reagent material (e.g., contained in structure 20 in FIG. 5) and thereby commence deposition of the L film layer. That "delay period" permits the titanium oxide reagent material (contained in structure 20 in FIG. 5) to cool from its vaporization temperature. If other cooling techniques are not employed, preferably that period between termination of the electron beam for vaporization of the titanium oxide material, and commencing operation of an electron beam to vaporize the L layer reagent material, will be at least about 2 minutes or more, preferably between about 3 and 15 minutes, more preferably between about 4 and 10 minutes.

The titanium oxide source material also may be more directly cooled by a coolant. For example, a containment structure 20 that contains the titanium oxide source material may be proximate to or even enveloped by a hollow jacket or duct through which a coolant may be flowed. Suitable coolants for use in such a duct include water, including water of reduced temperature, e.g. about 10° C. Flow of coolant through the containment structure duct may suitably commence at about the same time the electron beam that vaporizes the titanium oxide reagent material is terminated. A suitable cooling system is depicted in FIG. 6 where in a cut-away view a containment structure 50 is shown that includes a cooling system 52 for circulating fluids proximate to receptacles or crucibles 54 and 54' that hold coating material to be vaporized for ion plating deposition. A coolant such as water can be circulated through system 52 to reduce the temperature of a coating material contained in receptacles 54 and/or 54'. Cooling system 52 may be suitably subdivided into flow pathways (not shown) to enhance the efficiency of coolant flow through the system.

It has been found that such cooling of the titanium source material prior to commencing the L layer deposition can provide a titanium oxide/L material multilayer coating of enhanced physical properties as discussed above, including decreased optical absorbance. While not wishing to be bound by theory, it is believed that heated Ti effectively behaves as an oxygen absorber, i.e. the reactive heated titanium will combine with or getter away oxygen or other reactive materials. Thus, where the titanium reagent stays at an oxygen reactive temperature in the coating vessel during vaporization and deposition of an L layer such as a $SiO_2$ layer, oxygen can be consumed by the titanium reagent so as to form an insufficient oxygen environment for proper stoichiometric formation of the L layer. For example, in the case of deposition of $SiO_2$, this results in a coating layer that contains silicon-rich, oxygen deficient $Si_xO_y$ where the ratio y/x is less than 2, a silicon oxide species that is significantly optically absorbing.

After the titanium oxide layer has been deposited, and preferably the titanium oxide reagent material has been cooled as discussed above, ion plating deposition of the L material layer is carried out.

Preferably, in accordance with the invention, the L layer is deposited wherein the active (vaporized) L metal and oxygen reagents are present to form the layer in amounts sufficient to substantially inhibit formation of optically absorbing titanium oxide or L materials. By stating that the formation of optically absorbing titanium oxide or L materials are substantially inhibited, it is meant an ion-plated multilayer coating (e.g., about 100 or less or 70 or less total layers) containing the titanium oxide and L layers transmits at least about 85 percent of light intended for transmission relative to theoretical levels, more typically at least about 95 or 96 percent of incident light intended for transmission (relative to theoretical levels).

To achieve such inhibition of formation of optically absorbing materials, preferably the deposition rate of the L layer is decreased relative to known procedures. More specifically, preferably the L material is ion plated onto the coated substrate at less than 0.5 nm/second, more preferably at about 0.4 nm/second or less, still more preferably about 0.3 nm/second or less. Typically deposition rates of less than about 0.15 nm/second are less preferred. A deposition rate of about 0.25 nm/sec is particularly preferred, especially for deposition of a $SiO_2$ coating layer.

The deposition rate is preferably decreased by decreasing the effective reaction concentration of the non-oxygen reagent(s) (metal) of the L material coating layer. In other words, the deposition rate is decreased by decreasing the effective quantity (i.e., vapor pressure on or proximate to the surface to be coated) of evaporated metal constituent of the L layer. The metal constituent of a given coating will be readily apparent to those skilled in the art. For example, with respect to an SiO or $SiO_2$ coating layer, the metal constituent is Si, which is vaporized from a containment structure (reference numeral 22 or 22' in FIG. 5) as discussed above. For $Al_2O_3$ and MgO coating layer, the metal constituents are Al and Mg, which are suitably vaporized from a containment structure by an electron beam as discussed above.

The effective quantity of evaporated metal can be suitably decreased by reducing the evaporation rate of the reagent material from a containment structure, which can be accomplished by decreasing the power of the incident electron beam (16' in FIG. 5) directed to the reagent material by the electron beam gun (reference numeral 18 in FIG. 5). The power of the plasma beam can be decreased to a level until a preferred deposition rate as specified above is achieved.

It is particularly preferred that concentrations of the active oxygen *reagent (e.g., $O^{++}$) are not significantly decreased in order to decrease the deposition rate. Thus, the active oxygen reagent can be present in amounts in accordance as employed in known procedures, but the concentration of the active L layer metal reagent is decreased in order to provide effective ratios and amounts of the L layer reagents. An oxygen pressure of from about $7 \times 10^{-4}$ to about $1.1 \times 10^{-3}$ within coating vessel 12 (with the oxygen introduced through feedline(s) 30) during ion plating typically provides a suitable active oxygen reagent concentration for deposition of the layers of a multilayer coating of the invention. An oxygen pressure of from about $8 \times 10^{-4}$ to about $1 \times 10^{-3}$ within the coating vessel during an ion plating step is generally more preferred.

It also has been found that good results are achieved when the decreased deposition rate is employed for deposition of at least the initial portion of an L layer. For example, the decreased deposition rate may be suitably employed for only the first about 2 to about 10 seconds of the ion plating coating step, to provide at least about 2 or more L material mono-molecular layers of L material on the substrate. At that point, power to the vaporizing electron beam can be increased and the deposition rate increased.

Again without wishing to be bound by theory, it is believed that once a titanium layer is deposited on a substrate, that layer is capable reacting with oxygen in the coating vessel environment to form higher order oxides. More particularly, once the H layer (TiO$_x$) is deposited upon the substrate, the ion plating plasma turns on for the subsequent L layer deposition. That plasma chemically activates the previously deposited H layer. The chemical reactivity of this activated titania layer can be significant and will tend to getter oxygen or other reagents away from the local environment ("boundary layer") adjacent to the substrate/coating surface. For example, in the case of deposition of a SiO$_2$ L layer, $Si^{++}$ and $O^{++}$ ions interact at or near that boundary layer to form stoichiometric $SiO_2$. Because of that local gettering effect, undesirable non-stoichiometric suboxide $Si_xO_y$ may be formed on the L layer. To illustrate again with the deposition of a SiO$_2$ L layer, suboxide $Si_xO_y$ (y/x<2) can be formed at the interface as a result of the local gettering effect, and that suboxide material will deposit as the L layer. As discussed above, such suboxide $Si_xO_y$ species can be highly optically absorptive.

It was found that increasing oxygen pressure during the SiO$_2$ deposition in an attempt to alleviate the oxygen deficiency was not successful, but rather exacerbated the problem and tended to increase the optical absorbance of the deposited material. It is believed this situation resulted from the plasma (during an L layer deposition) interacting with the previously deposited H layer in an environment of additional oxygen pressure, the added O$_2$ actually creates a surface of higher order titania oxide. That form of titania oxide has a white/creamy appearance and is optically absorbing.

It was thus found that successful ion plating deposition is accomplished not by increasing the flux of available oxygen (increased oxygen pressure), but rather by decreasing the L material deposition rate, particularly by decreasing the oncoming flux of the metal constituent of the L layer, i.e. decreasing the effective quantity of vaporized L metal reagent proximate to the surface to be coated as discussed above.

Ion plating deposition conditions for application of L material and titanium coating layers may generally vary within a range of values, and may be readily determined empirically based on the present disclosure.

More specifically, for application of a thin film coating layer of SiO$_2$ onto a substrate, silicon is loaded into copper crucible containment 20' of vessel 12; if a pretreatment plasma step is employed, pretreatment plasma gas is oxygen or argon and a glow discharge rod 32 is used to provide the pretreatment plasma step at a voltage of about 4.5 kV, a current of about 350 mA and a duration of glow of 30 to 45 minutes. Following such a pretreatment step, or directly after applying the desired vacuum to vessel 12 if a pretreatment step is not carried out, the deposition plasma gas pressure within plasma source is 2.8 mbar; plasma voltage is from 55 to 60 volts; plasma current is from 55 to 60 amps; anode-to-ground voltage is 40 volts; plasma filament current is 110 amps; reactive gas is O$_2$ (introduced through line(s) 30 shown in FIG. 5); and the reactive gas pressure is $1 \times 10^{-3}$ mbar within the coating vessel.

The electron beam gun for reagent evaporation can be operated at a high voltage of 10 kV, an emission of 400 mA and at a rate of 0.5 nm/second.

However, more preferred is where modifications are made in accordance with the present invention, including decreasing the L material deposition rate. Thus, particularly preferred are the following parameters and conditions for deposition of a SiO$_2$ layer.

| | |
|---|---|
| Starting material: | Silicon |
| Crucible: | Copper |
| E-Beam high voltage: | 10kV |
| Emission: | 400mA |
| Deposition Rate: | 0.25 nm/s |
| Ramp 1: | 20s/38% |
| Ramp 2: | 40s/46% |
| Ramp 3: | 40s/51% |
| Hold Power: | 22.0% |
| Arc Current: | 55A |
| Arc Voltage: | 55V |
| Anode-to-Ground Voltage: | 35V |
| Plasma Gas: | Ar at 2.8 mbar with plasma source |
| Reaction Gas: | Oxygen at 1.0E-03 mbar within coating vessel |

Preferred deposition conditions for other L materials typically will be the same or similar as the above particularly preferred SiO$_2$ layer.

To apply a thin film coating layer of titanium oxide (including TiO$_x$ with x being about 2) onto a substrate, the titanium source chemical is loaded into a copper crucible containment vessel 20; if a pretreatment plasma step is employed, pretreatment plasma gas is oxygen and a glow discharge rod 32 is used to provide the pretreatment plasma step at a voltage of about 4.5 kV, a current of about 350 mA and a duration of glow of 30 to 45 minutes. Following pretreatment, or directly after applying the desired vacuum to vessel 12 if a pretreatment step is not carried out, the deposition plasma gas pressure within the plasma source is 2.8 mbar; plasma voltage is from 55 to 60 volts; plasma current is from 55 to 60 amps; anode-to-ground voltage is 40 volts; plasma filament current is 110 amps; the reactive gas is O$_2$; and the reactive gas pressure is $8 \times 10^{-4}$ mbar within the coating vessel. The electron beam gun for reagent evaporation is operated at a high voltage of 10 kV, an emission of 300 mA and at a rate of 0.5 nm/second.

Particularly preferred conditions for deposition of a essentially transparent $TiO_x$ (x being about 2) coating layer are the following:

| | |
|---|---|
| Starting material: | $Ti_3O_5$ (commercially available Balzers Ortim I) |
| Crucible: | Molybdenum liner placed into copper crucible |
| E-Beam high voltage: | 10kV |
| Emission: | 300mA |
| Rate: | 0.5 nm/s |
| Ramp 1: | 20s/35% |
| Ramp 2: | 40s/38% |
| Hold Power: | 1.0% |
| Arc Current | 60A |
| Arc Voltage: | 60V |
| Anode-to-Ground Voltage: | 40V |
| Plasma Gas: | Ar at 2.8 mbar with plasma source |
| Reaction Gas: | Oxygen at 8.0E-04 mbar within coating vessel |

It is noted that other forms of starting material may be successfully employed such as metallic Titanium, TiO, and $TiO_2$. Bulk absorption is minimized by a basic retuning of the deposition parameters.

As discussed above, semiconductor substrates (such as silicon wafers) and microelectronic devices are also provided that comprise an ion-plated titanium oxide multilayer coating of the invention. Active semiconductor substrates of the invention include both photovoltaic and photoconductive surfaces such as photodetectors and light emitting diodes (LED). Semiconductor substrates and devices onto which ionplated coating may be deposited in accordance with the invention can comprise silicon, CdTe, GaAs, HgCdTe, InSb, GaAlAs, PbTe, etc. Coated semiconductor substrates (such as silicon wafers) can be used as optical filters as well as electronic devices.

In particular, ion plated titanium oxide multilayer coatings of the invention can be deposited on microelectronic devices as optical coatings and for passivation layers. Coatings of the invention will be useful for deposition on photovoltaic and photoconductive optoelectronic devices. For example, diffused or implanted junction silicon diodes can be passivated by deposition of an ion-plated multilayer coating of the invention. The coating may be suitably deposited onto the optically active front surface of the device, or may be applied to the device's back surface. Such use of coatings of the invention provides a number of significant benefits including that the coatings are dense and permanent and are generally invariant to typical environmental exposures. The coating thus acts as a strong, hermetic encapsulant which may permit the coated device to be operated without any environmental enclosures (e.g., cans, dewars, etc.) as have been employed heretofore. The coatings are also resistant to absorption of water; coatings provided by prior processes can permit water absorption which would change the conductivity and therefore the electrical properties of the coatings. The multilayer coatings of the invention also can be tuned to provide desired spectral characteristics. Further, direct deposition of the multilayer coatings of the invention onto active semiconductor devices is substantially more time and cost efficient than prior approaches for limiting the responsiveness of a semiconductor device to a narrow spectral range that have entailed laminating discrete optical filter components on the device. Still further, since coatings of the invention exhibit substantially reduced stress relative to coatings produced by other methods as discussed above, stress-induced electrically active semiconductor defects (which can significantly increase dark current and reduce D* and responsivity) are reduced or eliminated. The reduced stress of coatings of the invention also allow for the coatings of large area thin semiconductor substrates, e.g., silicon substrates having a diameter or width of about 4 to 8 inches or more and a thickness of about less than 0.010 inches.

Coatings of the invention are highly useful as optical filters and coatings including bandpass filters and edge filters. In particular, Fabrey-Perot bandpass optical coatings of the invention have enhanced optical properties and simpler designs than previously employed systems. For example, three cavity $SiO_2/TiO_x$ multilayer bandpass filter coatings of the invention with simplified designs such as 3–7's and 3–9's exhibit the same or enhanced optical performance with increased manufacturing yields and lower production costs relative to prior systems such as three cavity $SiO_2/Ta_2O_5$ bandpass designs that included 3–11's or 3–13's, which as known in the art are difficult to manufacture and suffer limited production yield.

All documents mentioned herein are incorporated herein by reference in their entirety.

The following non-limiting examples are illustrative of the invention.

General comments

In the following examples, a commercially available BAP 800 Batch Ion Plating System available from Balzers Aktiengesellschaft was used to deposit the multilayer coatings. Percent transmission is sometimes referred to below and in the Figures of the Drawings as "% T". Deposition conditions were the same as the above specified particularly preferred conditions for deposition of $SiO_2$ and titanium oxide. That is, for deposition of $SiO_2$ layers in the coatings of the examples below, the following conditions were employed: starting material: silicon; crucible: copper; E-beam high voltage: 10 kV; emission: 400 mA; deposition rate: 0.25 nm/s; operation of plasma beam (3 separate ramps with about 2–3 second break between each ramp; % expressed as percent of possible full power of plasma beam): ramp 1: 20s/38%, ramp 2: 40s/46%, ramp 3: 40s/51%; hold power: 22.0%; arc current: 55 A; arc voltage: 55V; anode-to-ground voltage: 35V; plasma gas: argon at 2.8 mbar with plasma source; reaction gas introduced through one or more feedlines: 02 at $1.0 \times 10^{-3}$ mbar within coating vessel. For deposition of titanium oxide layers in the coatings of the examples below, the following conditions were employed: starting material: $Ti_3O_5$ (Balzers Ortim 1); containment crucible: molybdenum liner placed into copper crucible; E-beam high voltage: 10 kV; emission: 300 mA; deposition rate: 0.5 nm/s; operation of plasma beam (2 separate ramps with about 2–3 second break between each ramp; % expressed as % of full power of plasma beam): ramp 1: 20s/35%, ramp 2: 40s/38%; hold power: 1.0%; arc current: 60 A; arc voltage: 60V; anode-to-ground voltage: 40V; plasma gas: argon at 2.8 mbar with plasma source; reaction gas: $O_2$ at $8.0 \times 10^{-4}$ mbar within coating vessel.

EXAMPLE 1

Figure 7A:
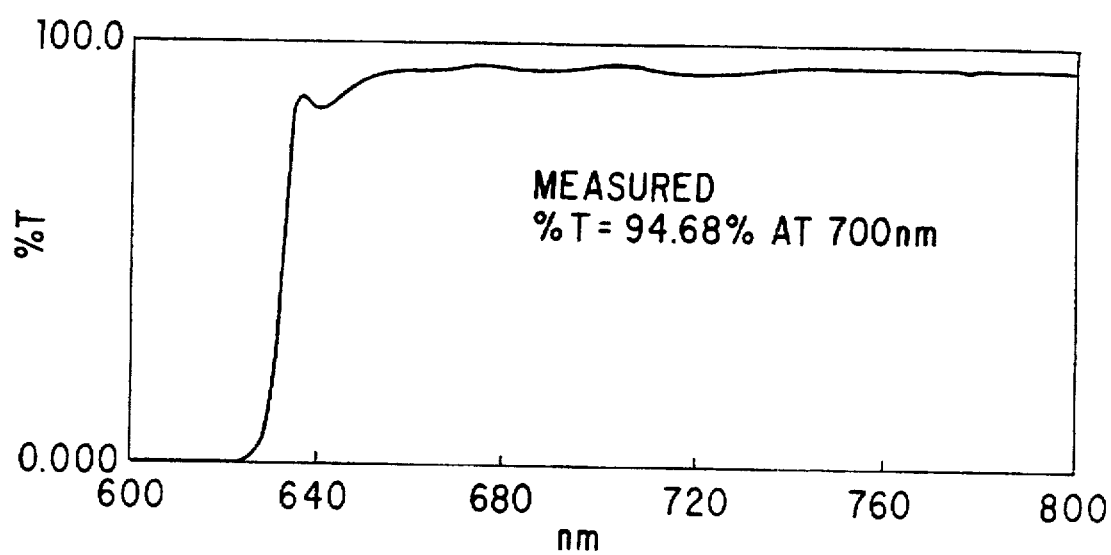
FIGS. 7A and 7B depict results of Example 1 which follows.
Figure 7B:
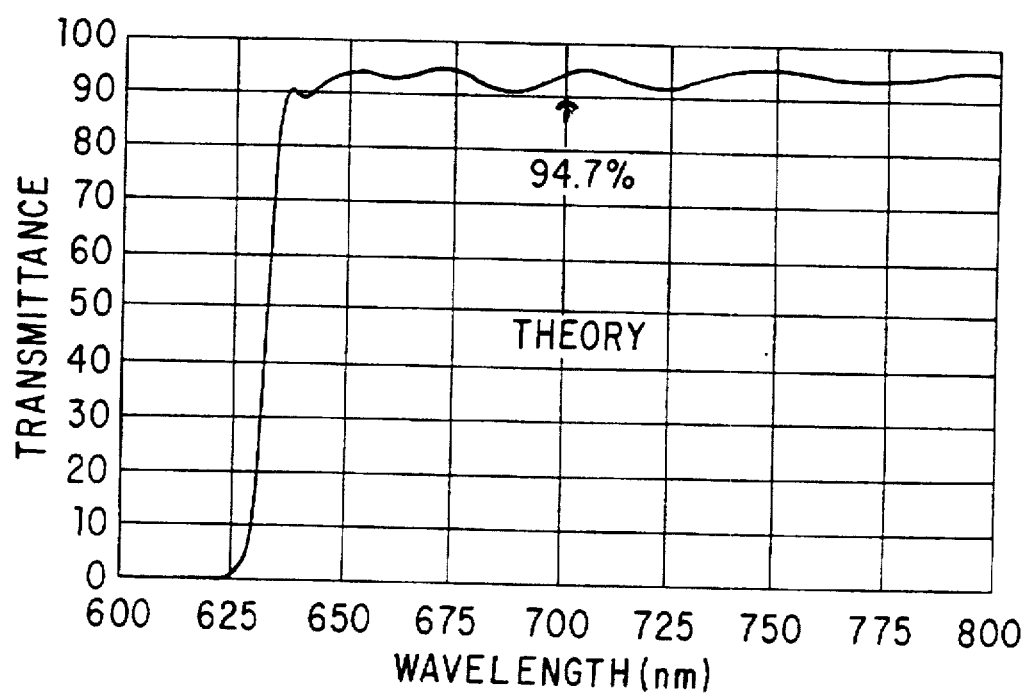

A 46 multilayer coating consisting of alternating layers of $SiO_2$ and $TiO_x$ (x being about 2) was deposited upon a Schott B-270 glass substrate to provide a long-wave-pass filter. FIGS. 7A shows the measured spectral scan (using a Hitachi U2000 spectrophotometer) of that 46 layer coating filter. FIG. 7B is a curve that shows the theoretical predicted transmission of the filter. As can be seen by comparison of FIGS. 7A and 7B, the filter exhibited transmission at or near theoretical levels.

EXAMPLE 2

Figure 8A:
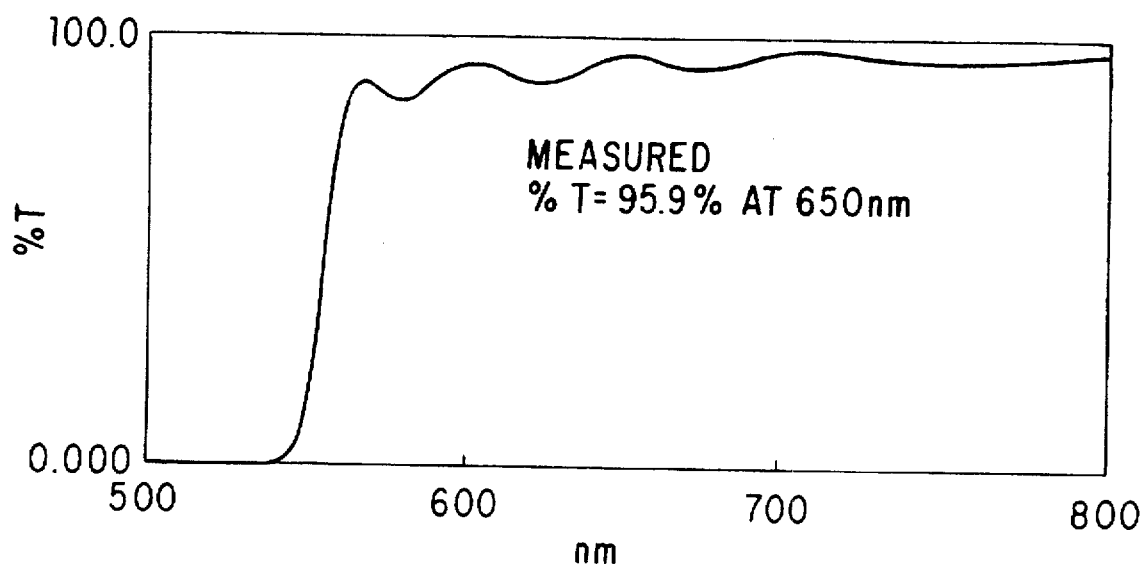
FIGS. 8A and 8B depict results of Example 2 which follows.
Figure 8B:
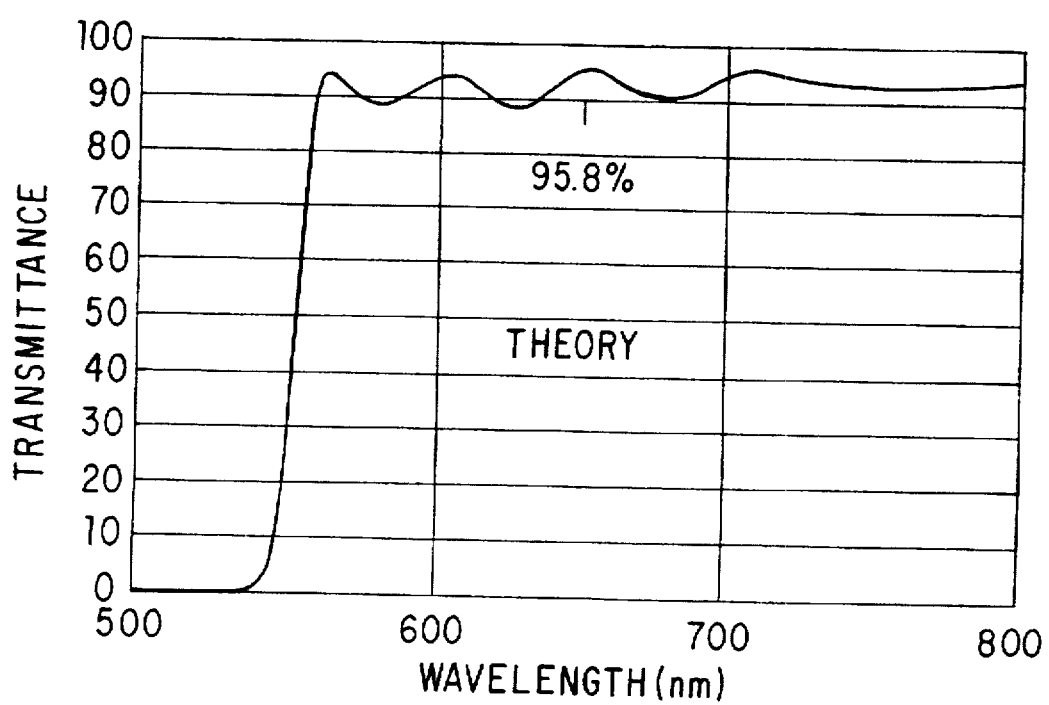

A 32 multilayer coating consisting of alternating layers of $SiO_2$ and $TiO_x$ (x being about 2) was deposited upon Schott B-270 glass substrate to provide a long-wave-pass filter. FIGS. 8A shows the measured spectral scan (using a Hitachi U2000 spectrophotometer) of that 46 layer coating filter. FIG. 8B is a curve that shows the theoretical predicted transmission of the filter. As can be seen by comparison of FIGS. 8A and 8B, the filter exhibited transmission at or near theoretical levels.

EXAMPLE 3

Figure 9A:
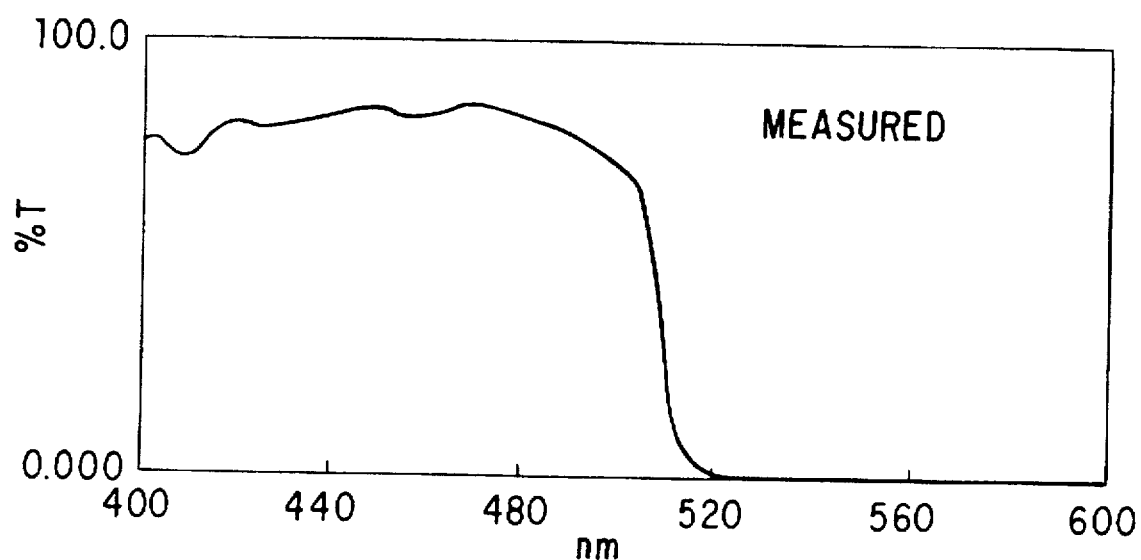
FIGS. 9A and 9B depict results of Example 3 which follows.
Figure 9B:
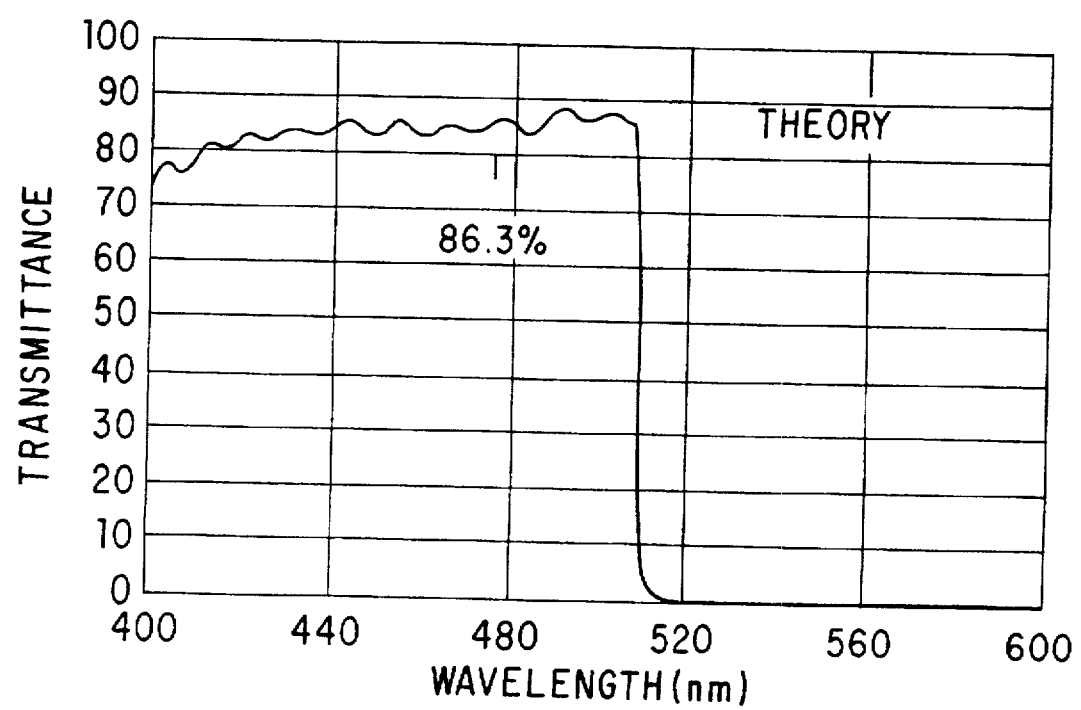

FIG. 9A shows measurements on multilayer coating on an absorbing Schott BG-39 blue colored glass. The multilayer coating consisted of alternating layers of $SiO_2$ and $TiO_x$ (x being about 2) 40 layer short-wave-pass coating. The measured % T is approximately 2.6% lower than theoretical prediction (shown in FIG. 9B). It is noted that BG-39 is a highly absorptive glass, whose transparency region has a % T which varies from lot-to-lot. Theoretical predictions on absolute % T are therefore difficult.

EXAMPLE 4

Figure 10A:
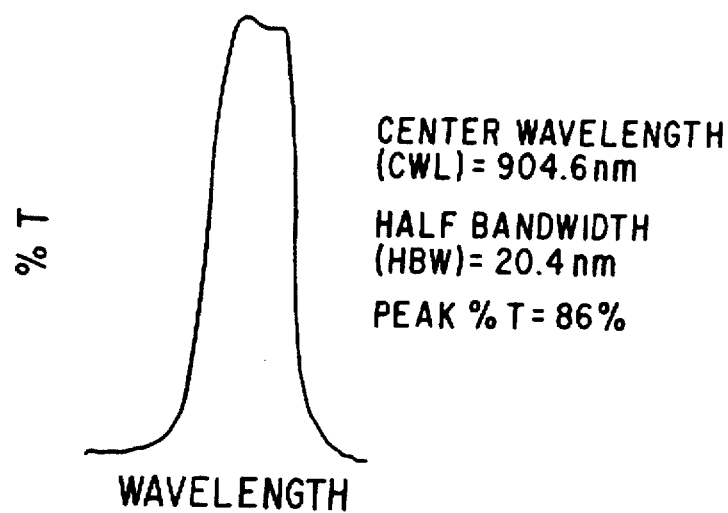
FIGS. 10A and 10B depict results of Example 4 which follows.

FIG. 10A shows transmission measurements of a fully blocked 905nm Fabrey-Perot type bandpass filter of the invention. The filter was produced by ion plating multilayers of $SiO_2$ and $TiO_x$ (x being about 2) bandpass design (30 layer 3-9's 4/4 approach) onto a Schott B-270 substrate. A blocking coating (28 layer of alternating $SiO_2$ and $TiO_x$ (x ≈2) short-wave-pass design) was also deposited upon B-270 glass. The total filter package consisted of those components laminated onto a 3mm thick substrate of absorptive Schott RG-850 glass. As shown in FIG. 10A, the measured % T(peak) of this filter package is 86%, significantly better than the 75% peak transmittance which was the minimum required.

The same filter package was deposited by ion plating as described for the filter of FIG. 10A and described above, except the $SiO_2$ layers were deposited as a rate of 0.5 nm/second or greater, and deposition of each $SiO_2$ was commenced immediately after completion of deposition of a titanium oxide layer. The % T of the resulting product was less than 55%, rendering the filter effectively unusable.

Figure 10B:
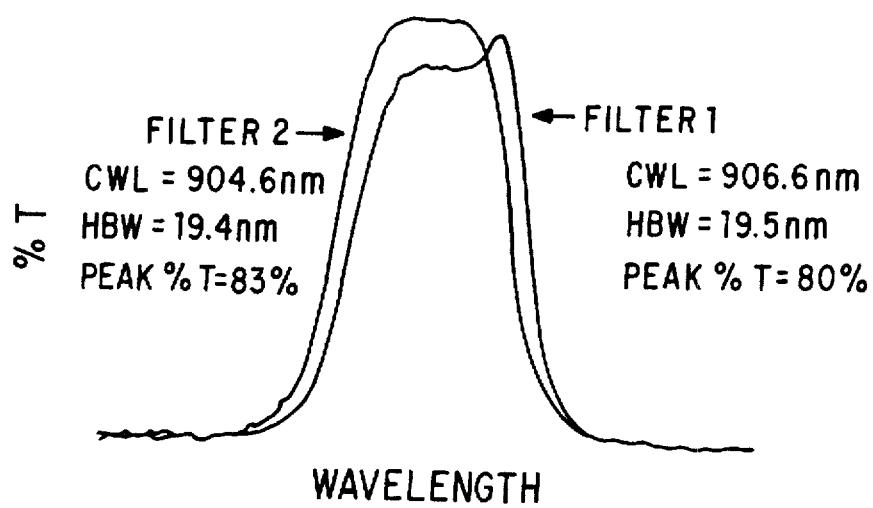
Figure 11:
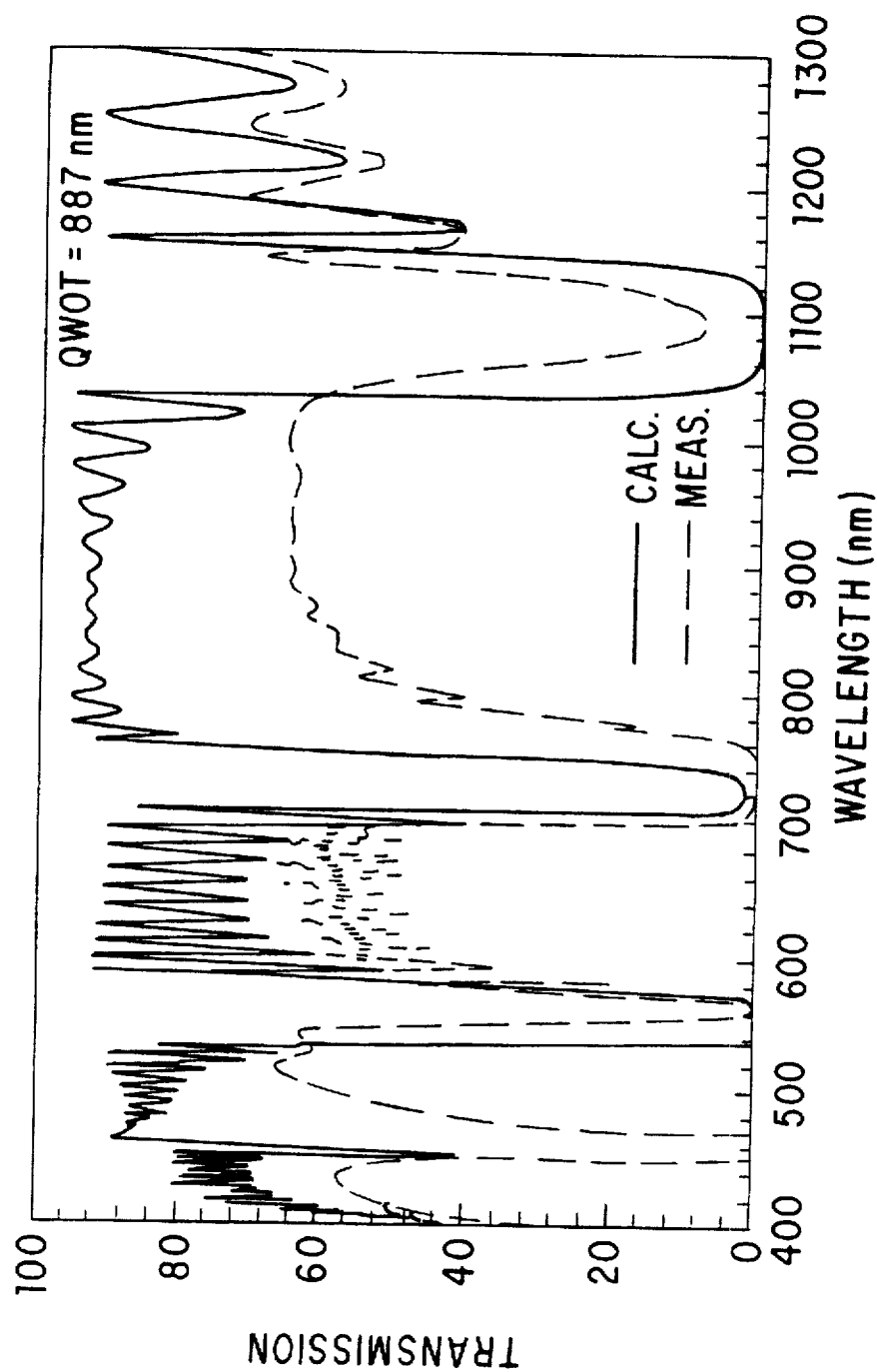
FIG. 11 depicts transmission properties of a prior multilayer coating.

FIG. 10B shows two commercially available bandpass filters (Filters 1 and 2) that were manufactured with standard laminated soft-coating techniques and have the same construction as the ion plated filter of FIG. 10A. As can be seen from FIG. 10B, the commercially available filters do not match the spectral quality of the ion plated filter of the invention (FIG. 10A).

The foregoing description of the invention is merely illustrative thereof, and it should be understood that variations and modifications can be affected without departing from the scope or spirit of the invention as set forth in the following claims.

What is claimed is:

1. A method for ion plating deposition of a multilayer coating onto a substrate, the coating comprising alternating layers of 1) titanium oxide and 2) a material having an index of refraction of less than 2.0, the method comprising steps of:

(a) depositing an ion plated titanium oxide film layer on a substrate, and (b) thereafter depositing over the titanium oxide film layer an ion plated film layer of the material having an index of refraction of less than 2.0, wherein a titanium reagent material used to form the titanium oxide layer is cooled to a temperature below its deposition temperature before commencing the depositing of the layer over the titanium oxide film layer.

2. The method of claim 1 wherein the titanium reagent material is cooled to a temperature where a solidified phase of the reagent material can be detected.

3. The method of claim 1 wherein the material having an index of refraction of less than 2.0 is $SiO_2$.

4. A method for ion plating deposition onto a substrate alternating layers of 1) titanium oxide and 2) a material having an index of refraction of less than 2.0 and formed from materials comprising a vaporized metal reagent and oxygen reagent, the method comprising steps of:

(a) depositing an ion plated titanium oxide film layer on a substrate, and (b) depositing on the titanium oxide film layer an ion plated film layer comprising a material having an index of refraction of less than 2 and formed from materials comprising a vaporized metal reagent and oxygen reagent, wherein the vaporized metal and oxygen reagents are present to form the layer comprising a material having an index of refraction of less than 2.0 in amounts sufficient to substantially inhibit formation of optically absorbing titanium oxide.

5. The method of claim 4 wherein the material having an index of refraction of less than 2.0 is deposited at rate of about 0.4 nm/second or less.

6. The method of claim 5 wherein layer of the material having an index of refraction of less than 2.0 is deposited in the presence of an oxygen pressure of from about $7 \times 10^{-4}$ to about $1.1 \times 10^{-3}$.

7. The method of claim 4 wherein the material having an index of refraction of less than 2.0 is $SiO_2$.

8. The method of claim 4 wherein the substrate is positioned in an ion plating coating apparatus that comprises a coating vessel capable of being evacuated to a reduced pressure and an ion plating deposition plasma source and one or more associated electron beam guns.

* * * * *